(12) United States Patent
Sakamoto

(10) Patent No.: US 6,709,973 B1
(45) Date of Patent: Mar. 23, 2004

(54) METHOD OF FABRICATING SEMICONDUCTOR DEVICE

(75) Inventor: Tatsuya Sakamoto, Kyoto (JP)

(73) Assignee: Rohm Co., Ltd, Kyoto (JP)

( * ) Notice: Subject to any disclaimer, the term of this patent is extended or adjusted under 35 U.S.C. 154(b) by 0 days.

(21) Appl. No.: 09/465,397

(22) Filed: Dec. 17, 1999

(30) Foreign Application Priority Data

Dec. 18, 1998 (JP) .......................... 10-361218
Dec. 18, 1998 (JP) .......................... 10-361221
Dec. 18, 1998 (JP) .......................... 10-361222

(51) Int. Cl.$^7$ ............................ H01L 21/4763
(52) U.S. Cl. ............... 438/633; 438/629; 438/631; 438/637
(58) Field of Search ................ 438/626, 631, 438/633, 634, 637, 629

(56) References Cited

U.S. PATENT DOCUMENTS 6,093,656 A * 7/2000 Lin .......................... 438/631
6,362,092 B1 * 3/2002 Shieh et al. ................. 438/631
6,376,361 B1 * 4/2002 Chooi et al. ................. 438/633

FOREIGN PATENT DOCUMENTS

| JP | 10050956 | 2/1998 |
| JP | 10189592 | 7/1998 |
| TW | 87109806 | 1/2000 |
| TW | 88121934 | 3/2001 |

* cited by examiner

Primary Examiner—Kevin M. Picardat
(74) Attorney, Agent, or Firm—Arent Fox Kintner Plotkin Kahn

(57) ABSTRACT

A method for disposing metal wiring on the surface of an insulating film formed on a semiconductor substrate. A recess is formed in the insulating film, and a metal wiring film composed of a metal wiring material is laminated on the insulating film having the recess formed therein. Further, the metal wiring film laminated on a surface area outside the recess in the insulating film is selectively removed. Thereafter, the metal wiring film laminated above the recess is polished by chemical mechanical polishing.

12 Claims, 9 Drawing Sheets

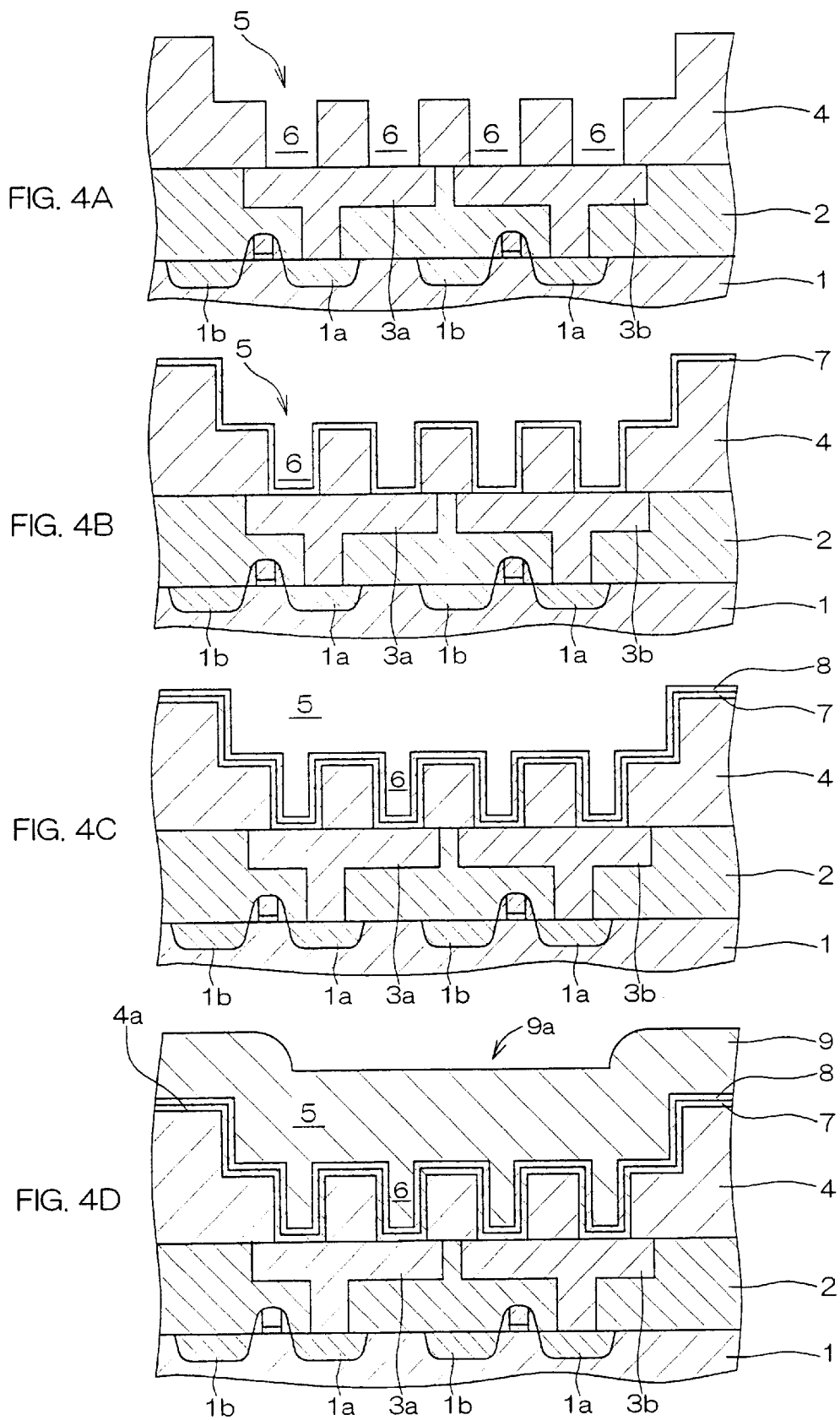

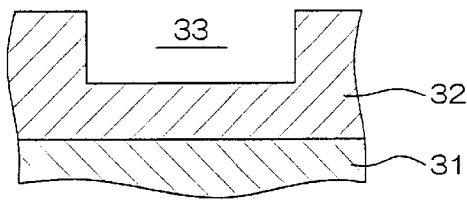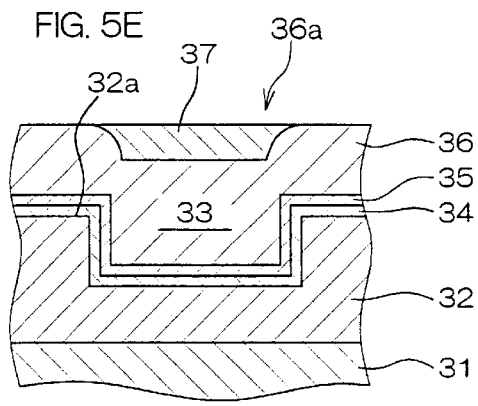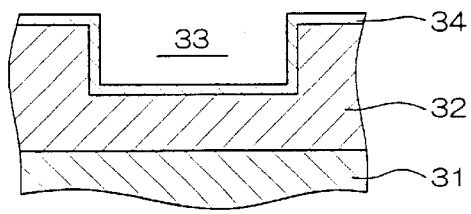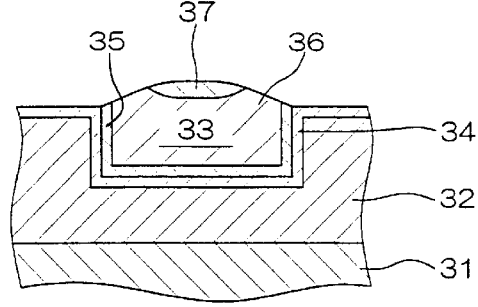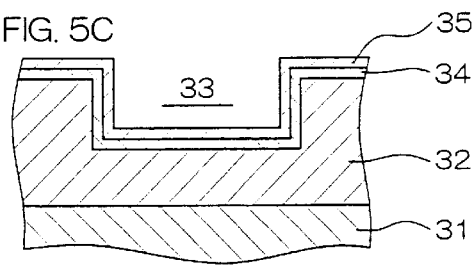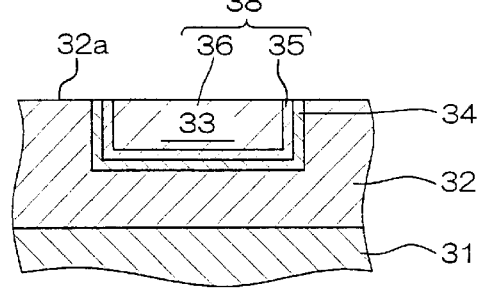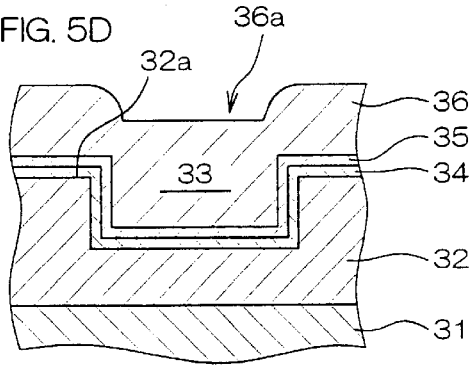

METHOD OF FABRICATING SEMICONDUCTOR DEVICE

BACKGROUND OF THE INVENTION

1. Field of the Invention

The present invention relates generally to a method of fabricating a semiconductor device such as LSI (large-scale integrated circuit), and more particularly, to a method for disposing metal wiring on the surface of an insulating film formed on a semiconductor substrate.

2. Description of Related Art

In the steps of fabricating a semiconductor device such as LSI, a so-called damascene process may, in some cases, be used in order to form a metal wiring pattern on the surface of an insulating film formed on a semiconductor substrate.

FIGS. 8A to 8G are cross-sectional views showing the steps of forming a metal wiring pattern by a conventional damascene process. As shown in FIG. 8A, an insulating film 92 composed of $SiO_2$ (silicon dioxide) is formed on a semiconductor substrate 91. As shown in FIG. 8B, a recess 93 for embedding metal wiring is formed by using a photolithography technique in a portion, corresponding to a region where metal wiring should be formed, on the surface of the insulating film 92.

Thereafter, as shown in FIG. 8C, a barrier metal film 94 composed of TiN (titanium nitride), for example, is formed on the insulating film 92 having the recess 93 formed therein. Further, as shown in FIG. 8D, a seed film 95 composed of a metal such as Cu (copper) is formed on the barrier metal film 94. As shown in FIG. 8E, the seed film 95 is subjected to electroplating using a metal of the same type as that composing the seed film 95, to form a metal wiring film 96.

CMP (Chemical Mechanical Polishing) processing is then performed, so that the metal wiring film 96, the seed film 95, and the barrier metal film 94 on the insulating film 92 are successively ground away, as shown in FIGS. 8E to 8G. All the metal wiring film 96, the seed film 95, and the barrier metal film 94, which are laminated on a surface area 92a outside the recess 93 in the insulating film 92, are ground away, so that the whole of the surface area 92a is exposed. The CMP processing is then terminated. Consequently, the pattern of metal wiring 97, which has been embedded in the recess 93, is formed on the surface of the insulating film 92.

In the above-mentioned conventional method, however, the surface, outside the recess 93, of the insulating film 92 and the surface of the metal wiring 97 are not flush with each other, and the surface of the metal wiring 97 becomes depressed in a dish shape in cross-sectional view, that is, so-called dishing occurs, as shown in FIG. 8G, at the time when the CMP processing is terminated.

The foregoing will be described in detail. If the metal wiring film 96 is formed on the seed film 95 by electroplating, a depression occurs in a portion, opposite to the recess 93 in the insulating film 92, on the surface of the metal wiring film 96, as shown in FIG. 8E. A surface plate pad used in CMP processing thereafter performed is composed of a material having flexibility, for example, foamed polyurethane. Therefore, the surface plate pad is deformed in a shape along the inequality in the surface of the metal wiring film 96, to polish the whole surface of the metal wiring film 96 almost uniformly. Consequently, the surface of the metal wiring film 96 is ground away in a state where the portion, opposite to the recess 93 in the insulating film 92, is depressed. At the time point where the surface of the metal wiring film 96 in the recess 93 is almost flush with the surface, outside the recess 93, of the insulating film 92, therefore, the metal wiring film 96, the seed film 95, and the barriermetal film 94 remain on the surface area 92a, as shown in FIG. 8F.

When the CMP processing is continued in order to remove the metal wiring film 96, the seed film 95, and the barrier metal film 94 which remain on the surface area 92a, the metal wiring film 96 in the recess 93 is gradually ground away. In the CMP processing, the metal wiring film 96 composed of a metal material such as Cu is ground away more easily than the barrier metal film 94 composed of TiN, for example. Therefore, after the barrier metal film 94 is exposed in the surface area 92a, the polishing rate of an area of the metal wiring film 96 in the recess 93 is higher than that in an area of the barrier metal film 94 on the surface area 92a. As a result, at the time point where the whole surface area 92a is exposed, the metal wiring 97, which is embedded in the recess 93, is dished.

By the dishing of the metal wiring 97, the cross-sectional area of the metal wiring 97 is smaller than its designed or desired value. As a result, the electrical resistance of the metal wiring 97 is larger than its designed or desired value.

In a case where multi-layer wiring is formed on a semiconductor substrate, if the metal wiring 97 is dished, the subsequent steps are adversely affected. In a case where the metal wiring 97 is dished, for example, when a further silicon dioxide insulating film is formed on the insulating film 92 in which the metal wiring 97 has been embedded, a portion, opposite to the metal wiring 97, on the surface of the further silicon dioxide insulating film becomes depressed, resulting in defocusing at the exposure process in a photolithographic process for patterning the further insulating film with a recess for embedding a further metal wiring. After a metal wiring film is formed on the further silicon dioxide insulating film, CMP processing is performed in order to remove an unnecessary portion, outside the recess, of the metal wiring film. However, the metal wiring film disadvantageously remains in a depression occurring in the further silicon dioxide insulating film. Therefore, the further metal wiring thus formed may be short-circuited by the remaining metal wiring film.

As a method of avoiding such a problem, it is considered that the photolithographic process is carried out after the surface of the further silicon dioxide insulating film is flattened. However, this method is not preferable because the number of steps is increased, thereby increasing the fabrication cost.

SUMMARY OF THE INVENTION

An object of the present invention is to provide a method of fabricating a semiconductor device, in which metal wiring can be prevented from being dished.

In order to attain the above-mentioned object, a first aspect of the present invention is directed to a method of fabricating a semiconductor device by disposing metal wiring on the surface of an insulating film formed on a semiconductor substrate, comprising the steps of forming a recess in the insulating film; laminating a metal wiring film composed of a metal wiring material on the insulating film having the recess formed therein; selectively removing the metal wiring film laminated on a surface area outside the recess in the insulating film; and polishing the metal wiring film laminated above the recess by chemical mechanical polishing after selectively removing the metal wiring film.

It is preferable that the step of polishing the metal wiring film by the chemical mechanical polishing is continued until the surface of the metal wiring film and the surface, outside the recess, of the insulating film are almost flush with each other.

According to the present invention, the metal wiring film on the surface area outside the recess in the insulating film is removed before processing using the chemical mechanical polishing is performed. Therefore, the chemical mechanical polishing processing for removing an unnecessary portion of the metal wiring film can be terminated at the time point where the surface of the metal wiring film is flush with the surface, outside the recess, of the insulating film. Consequently, the metal wiring embedded in the recess in the insulating film can be prevented from being dished.

Consequently, it is possible to obtain good-quality metal wiring having a cross-sectional area and an electrical resistance which are equal to their designed or desired values.

The surface of the insulated film and the surface of the metal wiring can be made almost flush with each other. When the method according to the present invention is applied to formation of multi-layer wiring, therefore, a new insulating film can be formed so as to be nearly flat on the insulating film and the metal wiring. Accordingly, it is possible to prevent defocusing at the exposure processing in a photolithographic process for patterning a further insulating film with a recess for embedding a further metal wiring. Further, it is possible to prevent the further metal wiring from being short-circuited by the metal wiring film remaining in a depression occurring in the further insulating film. Moreover, processing for flattening the further insulating film need not be additionally performed in order to prevent the defocusing and the short-circuit of the further metal wiring. Consequently, the fabrication cost is not increased.

It is preferable that the step of selectively removing the metal wiring film comprises the step of selectively forming a patterning mask in a region, opposite to the recess, on the surface of the metal wiring film, and the step of selectively removing a portion, other than a portion masked by the patterning mask, of the metal wiring film.

It is preferable that the portion, other than the portion masked by the patterning mask, of the metal wiring film is removed by etching.

According to the method, the metal wiring film on the surface area outside the recess in the insulating film can be removed by forming the patterning mask in the region, opposite to the recess, on the surface of the metal wiring film and then, etching the portion other than the portion masked by the patterning mask, for example.

It is preferable that the step of laminating a barrier metal film on the insulating film having the recess formed therein is further included between the step of forming the recess and the step of laminating the metal wiring film. In this case, it is preferable that the barrier metal film laminated on the surface area outside the recess in the insulating film is also selectively removed in the step of selectively removing the metal wiring film.

The barrier metal film is composed of Ti (titanium), TiN (titanium nitride), etc. In the chemical mechanical polishing, the barrier metal film is ground away less easily than a metal wiring film composed of a metal material such as Cu (copper). When the barrier metal film laminated on the surface area outside the recess in the insulating film, together with the metal wiring film, is polished in the chemical mechanical polishing processing, therefore, the polishing rate of the metal wiring film is higher than that of the barrier metal film. Therefore, the metal wiring film is ground away extra. As a result, the metal wiring is dished.

Therefore, the barrier metal film laminated on the surface area outside the recess in the insulating film, together with the metal wiring film laminated on the surface area outside the recess in the insulating film, is removed before the chemical mechanical polishing processing is performed. At the time of the chemical mechanical polishing processing, therefore, the metal wiring film is prevented from being excessively polished in order to remove the barrier metal film. Even in a case where the barrier metal film is formed, therefore, the metal wiring can be prevented from being dished.

A second aspect of the present invention is directed to a method of fabricating a semiconductor device by disposing metal wiring on the surface of an insulating film formed on a semiconductor substrate, comprising the steps of forming a recess in the insulating film; laminating a barrier metal film on the insulating film having the recess formed therein; selectively removing a portion, outside the recess, of the barrier metal film; depositing a metal wiring film composed of a metal wiring material on the barrier metal film remaining in the depression after removing the barrier metal film; and polishing the metal wiring film by chemical mechanical polishing.

According to the present invention, the portion, outside the recess, of the barrier metal film is removed prior to forming the metal wiring film. At the time of processing using the chemical mechanical polishing for removing an unnecessary portion of the metal wiring film, therefore, the metal wiring film is prevented from being excessively polished in order to remove the barrier metal film. Accordingly, it is possible to satisfactorily prevent the metal wiring from being dished.

Consequently, it is possible to obtain good-quality metal wiring having a cross-sectional area and an electrical resistance which are equal to their designed or desired values.

The step of polishing the metal wiring film by the chemical mechanical polishing is terminated at the time point where a surface, outside the recess, of the insulating film is exposed. Accordingly, a surface, inside the recess, of the metal wiring film and the surface, outside the recess, of the insulating film can be made almost flush with each other.

When the method according to the present invention is applied to formation of multi-layer wiring, therefore, a further insulating film can be formed so as to be nearly flat on the insulating film and the metal wiring. Accordingly, it is possible to prevent defocusing at the exposure processing in a photolithographic process for patterning the further insulating film with a recess for embedding a further metal wiring. Further, it is possible to prevent the further metal wiring from being short-circuited by the metal wiring film remaining in a depression occurring in the further insulating film. Moreover, processing for flattening the further insulating film need not be additionally performed in order to prevent the defocusing and the short-circuit of the metal wiring. Accordingly, the fabrication cost is not increased.

The metal wiring film may be formed on only the barrier metal film remaining inside the recess, or may be formed on both the surface, outside the recess, of the insulating film and on the barrier metal film remaining inside the recess.

It is preferable that the step of depositing the metal wiring film comprises the step of forming a seed film composed of a metal wiring material by sputtering on the barrier metal film remaining inside the recess, and the step of subjecting the seed film to electroplating using the metal wiring material.

Furthermore, in the step of selectively removing the barrier metal film, the portion, outside the recess, of the barrier metal film may be removed by the chemical mechanical polishing, or may be removed by forming a patterning mask for selectively covering a surface, inside the recess, of the barrier metal film and then, selectively etching a portion, other than a portion masked by the patterning mask, of the barrier metal film.

A third aspect of the present invention is directed to a method of fabricating a semiconductor device by disposing metal wiring on the surface of an insulating film formed on a semiconductor substrate, comprising the steps of forming a recess in the insulating film; depositing a metal wiring film composed of a metal wiring material on the insulating film having the recess formed therein; selectively forming a polishing adjusting film in a depression occurring, opposite to the recess, on the surface of the deposited metal wiring film; and polishing the metal wiring film by chemical mechanical polishing after forming the polishing adjusting film.

According to the present invention, the polishing adjusting film is formed in the depression occurring on the surface of the metal wiring film, and processing using the chemical mechanical polishing is then performed. Therefore, in the chemical mechanical polishing processing, a surface plate pad for physically polishing the surface of the metal wiring film can be prevented from polishing in a state where a portion, corresponding to the recess, on the surface of the metal wiring film is depressed. Consequently, the metal wiring embedded in the recess in the insulating film can be prevented from being dished.

Consequently, it is possible to obtain good-quality metal wiring having a cross-sectional area and an electrical resistance which are equal to their designed or desired values.

The metal wiring can be prevented from being dished. When the method according to the present invention is applied to formation of multi-layer wiring, therefore, the unequality in the surface of a further insulating film on the insulating film and the metal wiring can be reduced. Accordingly, it is possible to reduce the possibility of defocusing at the exposure processing in a photolithographic process for patterning the further insulating film with a recess for embedding a further metal wiring. Further, it is possible to prevent the further metal wiring from being short-circuited by the metal wiring film remaining in a depression occurring in the further insulating film. Moreover, processing for flattening the further insulating film need not be additionally performed in order to prevent the defocusing and the short-circuit of the further metal wiring. Accordingly, the fabrication cost is not increased.

It is preferable that the step of selectively forming the polishing adjusting film comprises the step of applying a material for the polishing adjusting film to the depression, and the step of baking the applied material for the polishing adjusting film. According to this method, it is possible to selectively form the polishing adjusting film relatively simply without using a patterning technique and an etching technique.

It is preferable that the step of polishing the metal wiring film by the chemical mechanical polishing is terminated at the time point where a surface area outside the recess in the insulating film is exposed, that is, at the time point where the surface of the metal wiring film is almost flush with the surface, outside the recess, of the insulating film.

In the method according to the present invention, the step of laminating a barrier metal film on the insulating film having the recess formed therein may be further included between the step of forming the recess and the step of depositing the metal wiring film. In this case, it is preferable that the polishing adjusting film is a polishing rate adjusting film whose polishing rate by the chemical mechanical polishing is lower than that of the metal wiring film and is higher than that of the barrier metal film.

According to this method, by forming the polishing rate adjusting film in the depression occurring on the surface of the metal wiring film, it is possible to adjust the progress of the polishing in each portion on the surface area of the metal wiring film. Consequently, it is possible to prevent a portion, inside the recess, of the metal wiring film from being polished extra by the chemical mechanical polishing processing. Even when the barrier metal film is formed, therefore, the metal wiring can be satisfactorily prevented from being dished.

The polishing adjusting film may be formed using a material whose polishing rate by the chemical mechanical polishing is approximately equal to that of the metal wiring film.

A material whose polishing rate is approximately equal to that of the metal wiring film may be a metal wiring material of the same type as that of the metal wiring film.

As in this method, by forming the polishing adjusting film of the metal wiring material having a polishing rate approximately equal to that of the metal wiring film, the surface of the metal wiring film on which the polishing adjusting film has been laminated can be almost uniformly polished in the chemical mechanical polishing.

In this case, it is particularly preferable that the polishing adjusting film is formed such that the surface thereof is almost flush with the surface of the metal wiring film. By terminating the chemical mechanical polishing processing at the time point where the surface area outside the recess in the insulating film is exposed upon removal of an unnecessary portion of the metal wiring film, therefore, the surface, outside the recess, of the insulating film and the surface, inside the recess, of the metal wiring film can be made almost flush with each other.

When the polishing adjusting film is composed of the metal wiring material of the same type as that of the metal wiring film, the metal wiring film may be formed to such a thickness that the bottom surface of the depression is lower than the surface, outside the recess, of the insulating film. In this case, the polishing adjusting film remains on the surface of the metal wiring film at the time point where the surface, outside the recess, of the insulating film and the surface, inside the recess, of the metal wiring film are flush with each other. The metal wiring can be constructed by the remaining polishing adjusting film and the metal wiring film. In this case, the amount of the metal wiring material required to form the metal wiring film can be reduced, thereby making it possible to construct the semiconductor device at low cost.

The metal wiring film may be formed to such a thickness that the bottom surface of the depression is higher than the surface, outside the recess, of the insulating film. In this case, at the time of the chemical mechanical polishing processing, the polishing adjusting film formed in the depression can be completely removed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A to 4G are cross-sectional views showing the steps of a method of fabricating a semiconductor device according to a fourth embodiment of the present invention;

FIGS. 5A to 5G are cross-sectional views showing the steps of a method of fabricating a semiconductor device according to a fifth embodiment of the present invention;

DESCRIPTION OF THE PREFERRED EMBODIMENTS

FIGS. 1A to 1I are cross-sectional views showing the steps of a method of fabricating a semiconductor device according to a first embodiment of the present invention. The fabricating method shown in FIGS. 1A to 1I is a method for forming a recess on the surface of an insulating film formed on a semiconductor substrate and disposing metal wiring in a state where it is embedded in the recess.

Figure 1A:
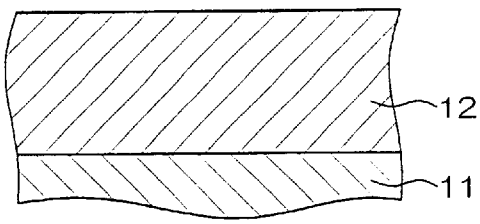
FIGS. 1A to 1I are cross-sectional views showing the steps of a method of fabricating a semiconductor device according to a first embodiment of the present invention.

As shown in FIG. 1A, an insulating film 12 composed of $SiO_2$ (silicon dioxide), for example, is formed on one surface of a silicon substrate 11. The insulating film 12 can be formed by thermal oxidation for heating the silicon substrate 11 in an oxygen atmosphere to oxidize one surface of the silicon substrate 11 or CVD (Chemical Vapor Deposition) for depositing an evaporated product of silicon dioxide on one surface of the silicon substrate 11.

Figure 1B:
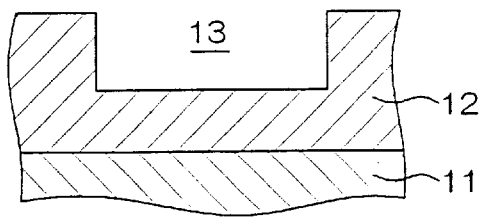
Figure 1C:
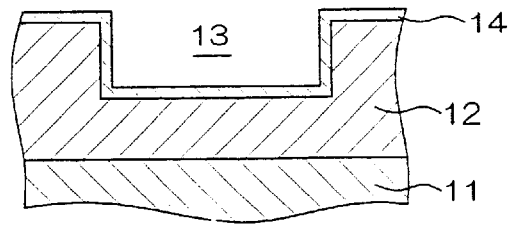
Figure 1D:
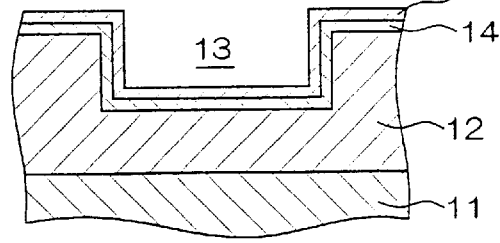
Figure 1E:
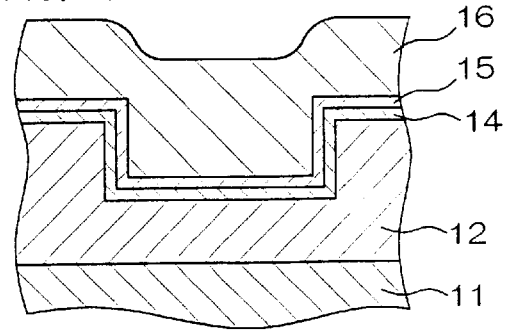

As shown in FIG. 1B, a recess 13 for embedding metal wiring is then formed in a portion, corresponding to a region where metal wiring should be formed, on the surface of the insulating film 12 by a photolithographic technique. As shown in FIG. 1C, a barrier metal film 14 composed of TiN (titanium nitride), for example, is then formed by sputtering on the insulating film 12 having the recess 13 formed therein. Further, as shown in FIG. 1D, a seed film 15 composed of Cu, for example, is formed by sputtering on the barrier metal film 14. As shown in FIG. 1E, a metal wiring film 16 composed of a metal (for example, Cu) of the same type as that of the seed film 15 is formed on the seed film 15 by electroplating, for example. The thickness of the metal wiring film 16 may be set to a thickness sufficient for the recess 13 to be filed with the metal wiring film 16. When a plurality of recesses are formed in the insulating film 12, it is preferably set to a thickness sufficient for the widest recess to be filled with the metal wiring film 16. When the depth of the recess 13 is approximately 1 $\mu$m, for example, it is preferable that the thickness of the metal wiring film 16 is set to approximately 2 to 3 $\mu$m.

The barrier metal film 14 is for preventing a metal such as Cu composing the seed film 15 from being diffused into the insulating film 12, and can be composed of any of Ti, Ta (tantalum), TaN (tantalum nitride), and W (tungsten), for example, in addition-to TiN, described above. It is possible to use, as materials for the seed film 15 and the metal wiring film 16, metal materials superior in conductivity, for example, Au (gold) and Ag (silver) in addition to Cu, described above.

Figure 1F:
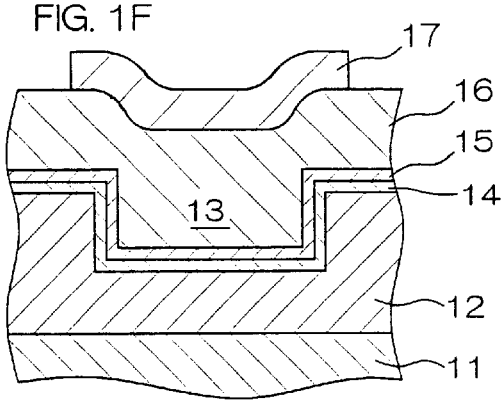

As shown in FIG. 1F, a patterning mask 17 composed of $SiO_2$, for example, is formed by a photolithographic technique in a region, opposite to the recess 13, on the surface of the metal wiring film 16. It is preferable that the thickness of the patterning mask 17 is set to approximately 0.1 to.

Figure 1G:
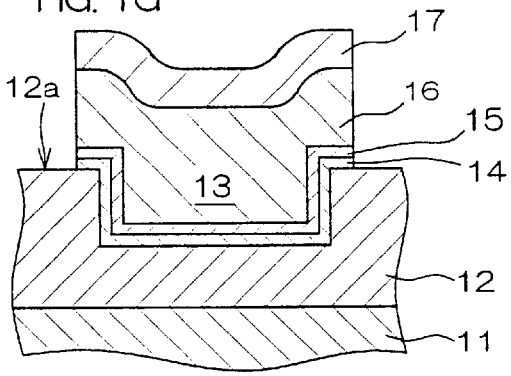

Thereafter, patterning by wet etching, for example, is performed in order to remove portions, other than portions masked by the patterning mask 17, of the barrier metal film 14, the seed film 15, and the metal wiring film 16. Consequently, as shown in FIG. 1G, only the barrier metal film 14, the seed film 15, and the metal wiring film 16 which have been laminated on the recess 13 in the insulating film 12 are left, so that almost the whole of a surface area 12a outside the recess 13 in the insulating film 12 is exposed.

Figure 1H:
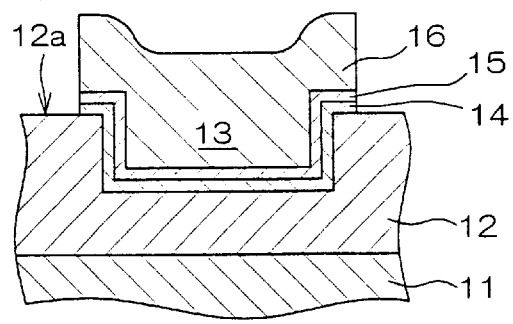
Figure 1I:
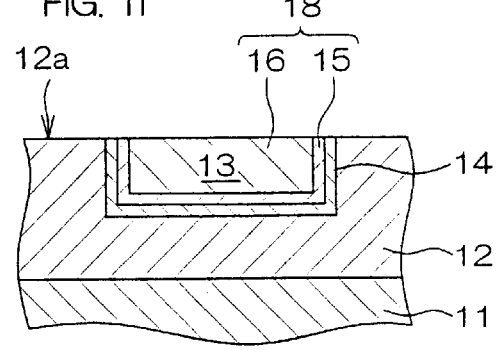

Thereafter, the patterning mask 17 is removed, as shown in FIG. 1H, by wet etching, for example. CMP (Chemical Mechanical Polishing) processing is then performed, so that the metal wiring film 16 on the recess 13 is ground away chemically and physically. When the surface of the metal wiring film 16 and the surface (the surface area 12a), outside the recess 13, of the insulating film 12 are almost flush with each other, the CMP processing is terminated. Consequently, the pattern of flat metal wiring 18 which has been embedded in the recess 13 can be obtained on the surface of the insulating film 12, as shown in FIG. 1I.

As described above, in the first embodiment, the barrier metal film 14, the seed film 15, and the metal wiring film 16 on the surface area 12a outside the recess 13 in the insulating film 12 are removed before the CMP processing. Therefore, the CMP processing for removing an unnecessary portion of the metal wiring film 16 can be terminated at the time point where the surface of the metal wiring film 16 is almost flush with the surface, outside the recess 13, of the insulating film 12. Consequently, the metal wiring 18 which has been embedded in the recess 13 in the insulating film 12 can be prevented from being dished. Therefore, it is possible to obtain good-quality metal wiring 18 having a cross-sectional area and an electrical resistance which are equal to their designed or desired values.

Furthermore, the surface of the insulating film 12 and the surface of the metal wiring 18 are almost flush with each other. When the method according to the present embodiment is applied to formation of multi-layer wiring, therefore, a further insulating film can be formed so as to be nearly flat on the insulating film 12 and the metal wiring 18. In a photolithographic process for patterning the further insulating film with a recess for embedding a further metal wiring, therefore, it is possible to prevent defocusing in the exposure processing. Further, it is possible to prevent the further metal wiring from being short-circuited by the metal wiring film remaining in a depression in the further insulating film. Moreover, processing for flattening the further insulating film need not be additionally performed in order to prevent the defocusing and the short-circuit of the metal wiring. Accordingly, the fabrication cost is not increased.

FIGS. 2A to 2H are cross-sectional views showing the steps of a method for fabricating a semiconductor device according to a second embodiment of the present invention. The fabricating method shown in FIGS. 2A to 2H is a method for forming a recess on the surface of an insulating film formed on a semiconductor substrate and disposing metal wiring in a state where it is embedded in the recess. In FIGS. 2A to 2H, portions corresponding to the portions shown in FIGS. 1A to 1I are assigned the same reference numerals as those shown in FIGS. 1A to 1I. However, this does not necessarily mean that the portions respectively assigned the same reference numerals in FIGS. 1A to 1I and FIG. 2A to 2H are completely the same.

Figure 2A:
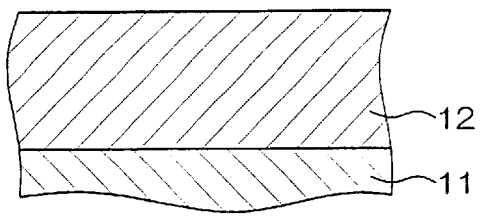
FIGS. 2A to 2H are cross-sectional views showing the steps of a method of fabricating a semiconductor device according to a second embodiment of the present invention.

As shown in FIG. 2A, an insulating film 12 composed of $SiO_2$ (silicon dioxide), for example, is formed on one surface of a silicon substrate 11. The insulating film 12 can be formed by thermal oxidation for heating the silicon substrate 11 in an oxygen atmosphere to oxidize one surface of the silicon substrate 11 or CVD (Chemical Vapor Deposition) for depositing an evaporated product of silicon dioxide on one surface of the silicon substrate 11.

Figure 2B:
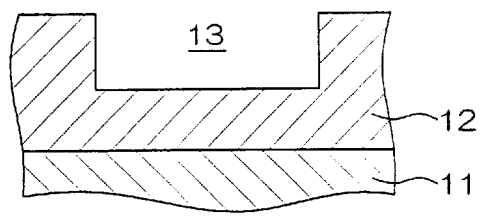
Figure 2C:
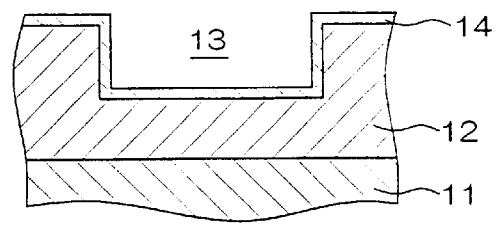

As shown in FIG. 2B, a recess 13 for embedding metal wiring is then formed in a portion, corresponding to a region where metal wiring should be formed, on the surface of the insulating film 12 by a photolithographic technique. As shown in FIG. 2C, a barrier metal film 14 composed of TiN, for example, is then formed by sputtering on the insulating film 12 having the recess 13 formed therein. The barrier metal film 14 is for preventing a metal such as Cu composing the metal wiring from being diffused into the insulating film 12, and can be composed of any of Ti, Ta (tantalum), TaN (tantalum nitride), and W (tungsten), for example, in addition to TiN, described above.

Figure 2D:
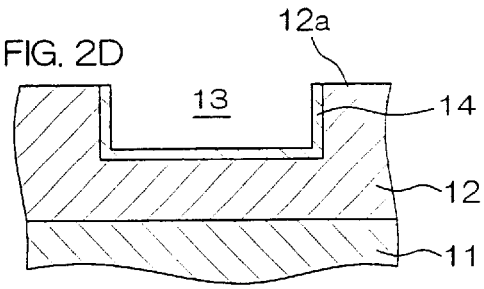
Figure 2E:
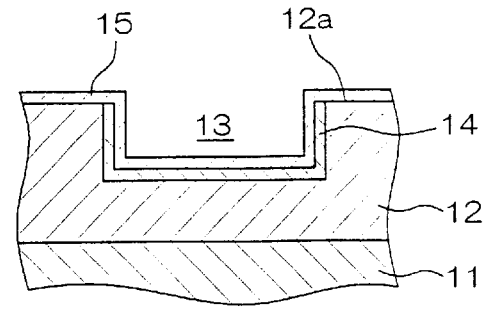

Thereafter, CMP (Chemical Mechanical Polishing) processing is performed, to remove a portion, outside the recess 13, of the barrier metal film 14, as shown in FIG. 2D. Consequently, the whole of a surface 12a outside the recess 13 in the insulating film 12 is exposed, so that the barrier metal film 14 is left in only the recess 13.

Figure 2F:
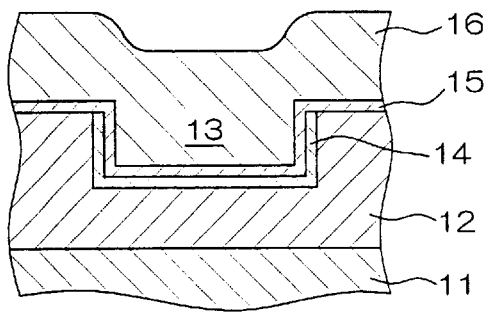

A seed film 15 composed of Cu, for example, is formed by sputtering on the surface 12a outside the recess 13 in the insulating film 12 and on the surface of the barrier metal film 14 which is left in the recess 13. As shown in FIG. 2F, a metal wiring film 16 composed of the same metal (for example, Cu) as that of the seed film 15 is formed on the seed film 15 by electroplating, for example.

The thickness of the metal wiring film 16 may be set to a thickness sufficient for the recess 13 to be filled with the metal wiring film 16. When a plurality of recesses are formed in the insulating film 12, it is preferably set to a thickness sufficient for the widest recess to be filled with the metal wiring film 16. When the depth of the recess 13 is approximately 1 μm, for example, it is preferable that the thickness of the metal wiring film 16 is set to approximately 2 to 3 μm. It is possible to use, as materials for the seed film 15 and the metal wiring film 16, metal materials superior in conductivity, for example, Au (gold) and Ag (silver), in addition to Cu, described above.

Figure 2G:
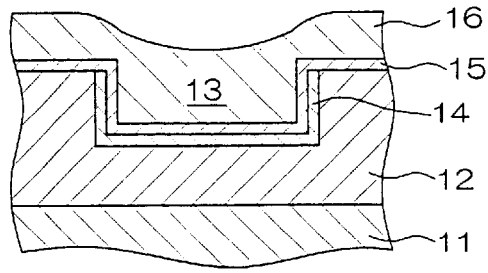
Figure 2H:
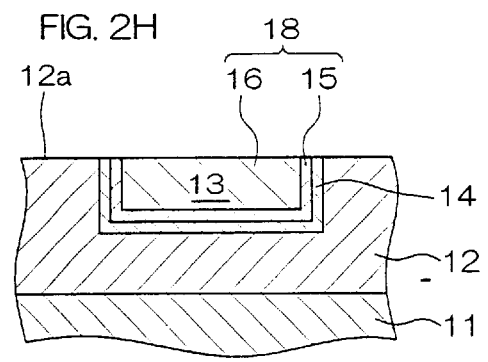

As shown in FIG. 2G, the CMP processing is then performed, to chemically and physically polish an unnecessary portion of the metal wiring film 16 on the seed film 15 and a portion, outside the recess 13, of the seed film 15. As shown in FIG. 2H, the whole of the portion, outside the recess 13, of the seed film 15 is removed, so that the surface 12a outside the recess 13 in the insulating film 12 is exposed. When the surface 12a and a surface, inside the recess 13, of the metal wiring film 16 are almost flush with each other, the CMP processing is terminated. Consequently, the pattern of metal wiring 18 can be obtained.

As described above, in the second embodiment, the barrier metal film 14 on the surface 12a outside the recess 13 in the insulating film 12 is removed prior to forming the seed film 15 (prior to forming the metal wiring film 16). The metal wiring film 16 is prevented from being excessively polished in order to remove the barrier metal film 14 at the time of the CMP processing for removing an unnecessary portion of the seed film 15 and an unnecessary portion of the metal wiring film 16. Accordingly, the metal wiring 18 can be satisfactorily prevented from being dished.

Consequently, it is possible to obtain good-quality metal wiring 18 having a cross-sectional area and an electrical resistance which are equal to their designed or desired values.

The CMP processing for removing the unnecessary portion of the metal wiring film 16 is terminated at the time point where the surface 12a outside the recess 13 in the insulating film 12 is exposed upon removal of the whole of the portion, outside the recess 13, of the seed film 15. Consequently, the surface, inside the recess 13, of the metal wiring film 16 and the surface, outside the recess 13, of the insulating film 12 can be made flush with each other. When the method according to the present embodiment is applied to formation of multi-layer wiring, the inequality in the surface of a further insulating film formed on the insulating film 12 and the metal wiring 18 can be reduced. In a photolithographic process for patterning the further insulating film with a recess for embedding a further metal wiring, therefore, it is possible to prevent defocusing in the exposure processing. Further, it is possible to prevent the metal wiring from being short-circuited by the metal wiring film remaining in a depression in the further insulating film. Moreover, processing for flattening the further insulating film need not be additionally performed in order to prevent the defocusing and the short-circuit of the metal wiring. Accordingly, the fabrication cost is not increased.

FIGS. 3A to 3J are cross-sectional views showing the steps of a method of fabricating a semiconductor device according to a third embodiment of the present invention. In FIGS. 3A to 3J, portions corresponding to the portions shown in FIGS. 2A to 2H are assigned the same reference numerals as those shown in FIGS. 2A to 2H. However, this does not necessarily mean that the portions respectively assigned the same reference numerals in FIGS. 2A to 2H and FIGS. 3A to 3J are completely the same.

In the fabricating method shown in FIGS. 2A to 2H, the portion, outside the recess 13, of the barrier metal film 14 is removed by the CMP processing. On the other hand, in the fabricating method shown in FIGS. 3A to 3J, a portion, outside a recess 13, of a barrier metal film 14 is removed by etching.

Figure 3A:
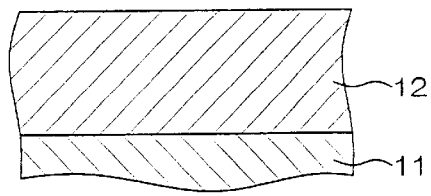
FIGS. 3A to 3J are cross-sectional views showing the steps of a method of fabricating a semiconductor device according to a third embodiment of the present invention.
Figure 3G:
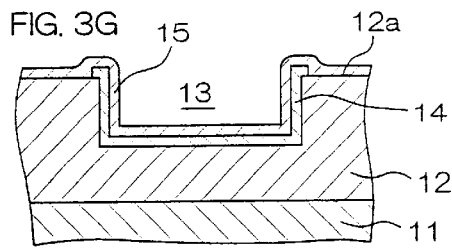
Figure 3B:
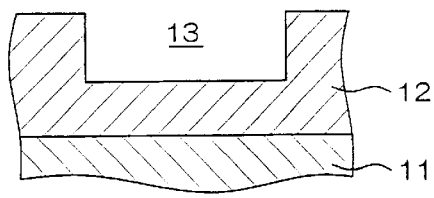
Figure 3H:
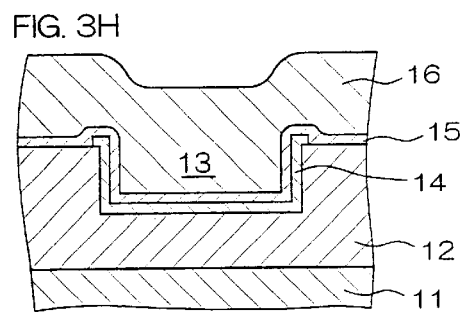
Figure 3C:
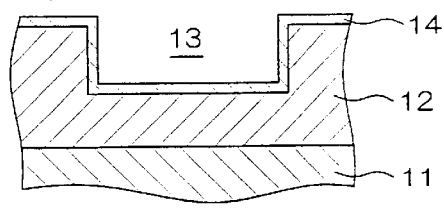

Specifically, as shown in FIG. 3A, an insulating film 12 composed of $SiO_2$, for example, is formed on one surface of a silicon substrate 11 by thermal oxidation or CVD. As shown in FIG. 3B, a recess 13 for embedding metal wiring is then formed in a portion, corresponding to a region where metal wiring should be formed, on the surface of the insulating film 12 by a photolithographic technique. As shown in FIG. 3C, a barrier metal film 14 composed of TiN, for example, is then formed by sputtering on the insulating film 12 having the recess 13 formed therein.

Figure 3D:
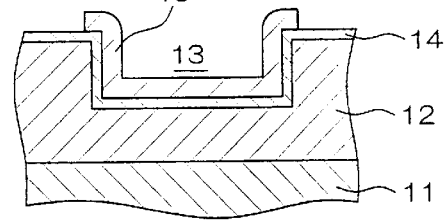

Thereafter, as shown in FIG. 3D, a patterning mask 19 composed of $SiO_2$, for example, is selectively formed so as to cover a surface, inside the recess 13, of the barrier metal film 14 by a photographic process. In order to remove a portion, other than a portion masked by the patterning mask 19, of the barrier metal film 14, dry etching, for example, is performed. Consequently, as shown in FIG. 3E, only a portion, inside the recess 13, of the barrier metal film 14 is left, so that the whole of a surface 12a outside the recess 13 in the insulating film 12 is exposed.

Figure 3I:
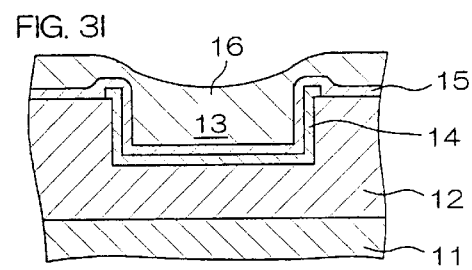
Figure 3E:
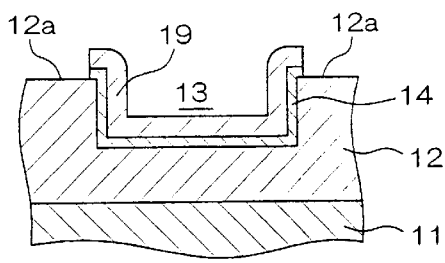
Figure 3J:
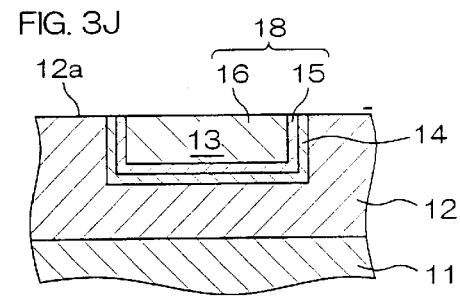
Figure 3F:
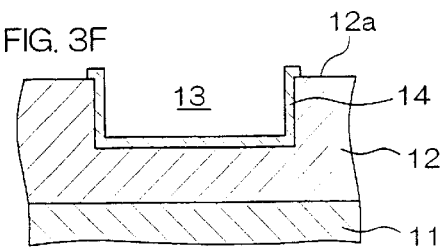

The patterning mask 19 is then removed, as shown in FIG. 3F, by wet etching, for example. As shown in FIG. 3G, a seed film 15 composed of Cu, for example, is then formed by sputtering on the surface 12a outside the recess 13 in the insulating film 12 and on the surface, inside the recess 13, of the barrier metal film 14. As shown in FIG. 3H, a metal wiring film 16 composed of Cu, for example, is formed on the seed film 15 by electroplating, for example.

Thereafter, as shown in FIG. 3I, CMP processing is performed, to chemically and physically polish an unnecessary portion of the metal wiring film 16 and a portion, outside the recess 13, of the seed film 15. As shown in FIG. 3J, the whole of a potion, outside the recess 13, of the seed film 15 is removed, so that the surface 12a outside the recess 13 in the insulating film 12 is exposed. When the surface 12a and a surface, inside the recess 13, of the metal wiring film 16 are almost flush with each other, the CMP processing is terminated. Consequently, the pattern of metal wiring 18 can be obtained.

Also by the above-mentioned method, the same effect as that in the above-mentioned fabricating method shown in FIGS. 2A to 2H can be achieved.

FIGS. 4A to 4G are cross-sectional views showing the steps of a method of fabricating a semiconductor device according to a fourth embodiment of the present invention. The fabricating method shown in FIGS. 4A to 4G is a method applied in the steps carried out after forming an insulating film 2 composed of $SiO_2$ (silicon dioxide), for example, on a silicon substrate 1 having a source region 1a and a drain region 1b formed therein, for example, and further embedding primary metal wires 3a and 3b (hereinafter generically referred to as "primary metal wiring 3") in the surface of the insulating film 2, and a method for forming a further insulating film 4 on the insulating film 2 having the primary metal wiring 3 embedded therein and embedding secondary metal wiring in the further insulating film 4.

As shown in FIG. 4A, an evaporated product of $SiO_2$ is deposited on the surface of the insulating film 2 using CVD (Chemical Vapor Deposition), to form a further insulating film 4 on the insulating film 2. A recess 5 and a plurality of contact holes 6 reaching the surface of the primary metal wiring 3 from the bottom surface of the recess 5 are formed in the insulating film 4 by a photolithographic technique.

As shown in FIG. 4B, a barrier metal film 7 composed of TiN (titanium nitride), for example, is then formed by sputtering on the surface of the insulating film 4 and on the surface of the primary metal wiring 3 exposed through the recess 5 and the contact holes 6. The barrier metal film 7 is for preventing a metal such as Cu composing the secondary metal wiring from being diffused into the insulating film 2, and can be composed of any of Ti, Ta (tantalum), TaN (tantalum nitride), W (tungsten), for example, in addition to TiN, described above.

As shown in FIG. 4C, a seed film 8 composed of Cu, for example, is formed by sputtering on the surface of the barrier metal film 7. As shown in FIG. 4D, a metal wiring film 9 composed of the same metal (for example, Cu) as the seed film 8 is formed on the surface of the seed film 8 by electroplating, for example. At this time, a depression 9a caused by the formation of the recess 5 and the contact holes 6 on the surface of the insulating film 4 occurs on the surface of the metal wiring film 9.

It is possible to use, as materials for the seed film 8 and the metal wiring film 9, metal materials superior in conductivity, for example, Au (gold) and Ag (silver), in addition to Cu, described above. In the present embodiment, the metal wiring film 9 is formed to such a thickness that the bottom surface of the depression 9a is higher than a surface 4a outside the recess 5 in the insulating film 4. When the thickness of the insulating film 4 is approximately 2 μm, and the depth of the recess 5 is approximately 1 μm, for example, the metal wiring film 9 is formed so as to have a thickness of not less than approximately 1 μm from a surface, outside the recess 5, of the seed film 8.

Figure 4E:
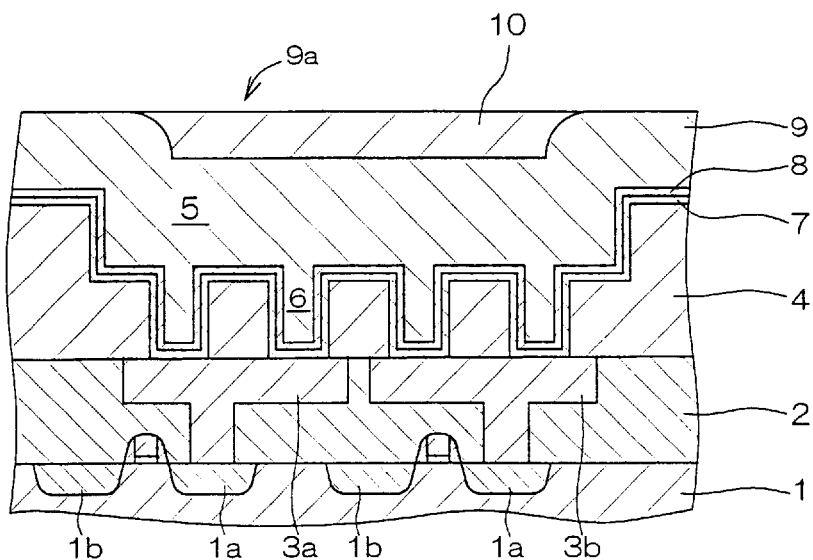

As shown in FIG. 4E, a polishing rate adjusting film 10 is embedded in the depression 9a on the surface of the metal wiring film 9 such that the surface thereof is almost flush with the surface of the metal wiring film 9. The polishing rate, in CMP (Chemical Mechanical Polishing) processing performed later, of the polishing rate adjusting film 10 is lower than that of the metal wiring film 9 and is higher than that of the barrier metal film 7. The polishing rate adjusting film 10 can be formed by applying liquid $SiO_2$ to the inside of the depression 9a, followed by baking processing when the barrier metal film 7 is composed of TiN and the metal wiring film 9 is composed of Cu. It is preferable that the temperature at which the baking processing is performed is approximately 400 to 500° C. The processing time may be set to sufficient time for $SiO_2$ applied to the inside of the depression 9a to be sintered.

Figure 4F:
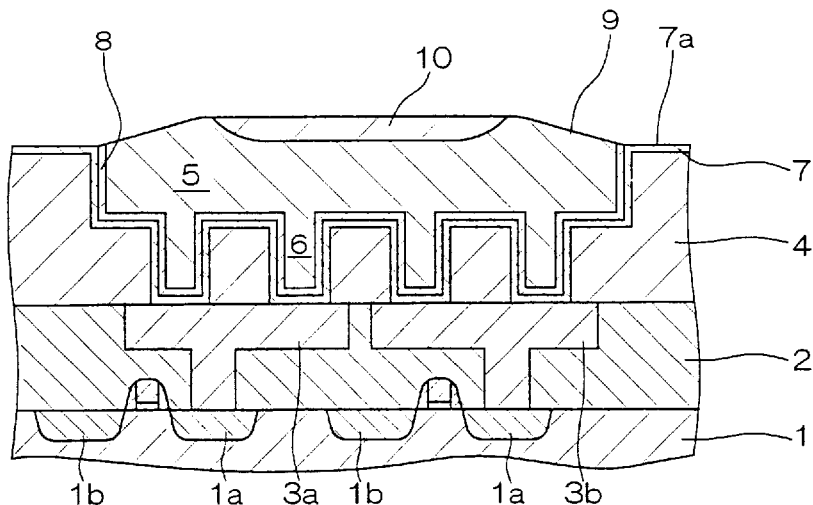
Figure 4G:
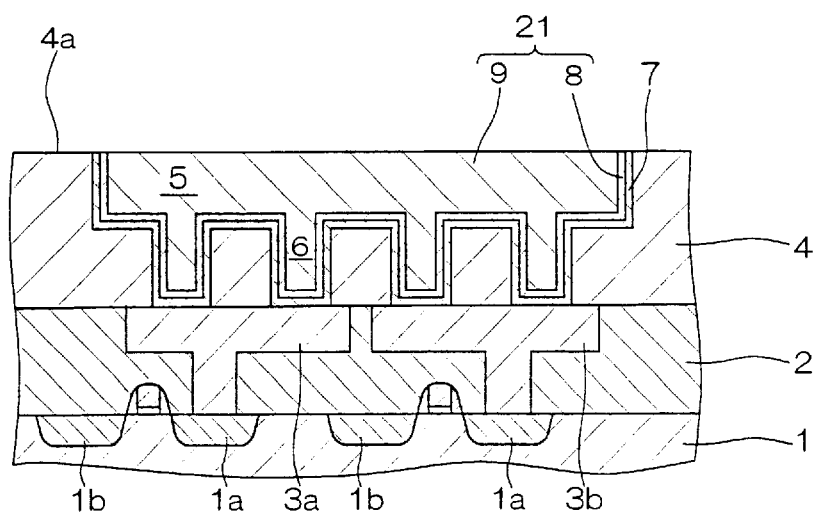

After the polishing rate adjusting film 10 is thus formed, the CMP processing is performed, to chemically and physically polish the metal wiring film 9 and the polishing rate adjusting film 10. In the CMP processing, the polishing rate of the metal wiring film 9 is higher than that of the polishing rate adjusting film 10. Accordingly, the metal wiring film 9 is ground away in a larger amount than the polishing rate adjusting film 10. At the time point where a surface 7a, outside the recess 5, of the barrier metal film 7 is exposed, therefore, a part of the metal wiring film 10 with the polishing rate adjusting film 10 formed on its surface is raised, as shown in FIG. 4F.

After the surface 7a of the barrier metal film 7 is exposed, the polishing rate of the polishing rate adjusting film 10 is lower than that of the barrier metal film 7. Accordingly, the polishing rate adjusting film 10 is ground away in a larger amount than the barrier metal film 7. Consequently, the barrier metal film 7 is polished, and the raised part of the metal wiring film 9 with the polishing rate adjusting film 10 formed thereon is gradually flattened. When the surface 4a outside the recess 5 in the insulating film 4 is exposed upon completion of the removal of the portion, outside the recess 5, of the barrier metal film 7, the CMP processing is terminated. At this time point, the surface 4a outside the recess 5 in the exposed insulating film 4 and the surface of the metal wiring film 9 are almost flush with each other. Consequently, secondary metal wiring 21 having a flat surface is obtained (see FIG. 4G).

As described in the foregoing, according to the present embodiment, the polishing rate adjusting film 10 is formed in the depression 9a on the surface of the metal wiring film 9, thereby making it possible to adjust the progress of the CMP processing in each portion on a surface area of the metal wiring film 9. At the time point where the surface 4a outside the recess 5 in the insulating film 4 is exposed upon removal of the whole of the portion, outside the recess 5, of the barrier metal film 7, the surface 4a of the insulating film 4 and the surface of the metal wiring film 9 can be almost flush with each other.

Accordingly, the secondary metal wiring 21 can be prevented from being dished, thereby making it possible to obtain good-quality secondary metal 15 wiring 21 having a cross-sectional area and an electrical resistance which are equal to their designed or desired values.

The surface 4a of the insulating film 4 and the surface of the metal wiring film 9 are almost flush with each other. When the insulating film 4 is further subjected to further metal wiring (ternary metal wiring), a further insulating film can be formed so as to be nearly flat on the insulating film 4. In a photolithographic process for patterning the further insulating film with a recess for embedding the ternary metal wiring, therefore, it is possible to prevent defocusing at the exposure processing. Further, it is possible to prevent the metal wiring from being short-circuited by the metal wiring film remaining in a depression in the further insulating film. Moreover, processing for flattening the further formed insulating film need not be additionally performed in order to prevent the defocusing and the short-circuit of the metal wiring. Accordingly, the fabrication cost is not increased.

In the present embodiment, the polishing rate adjusting film 10 is formed in the depression 9a of the metal wiring film 9 such that the surface thereof is almost flush with the surface of the metal wiring film 9. However, the surface of the polishing rate adjusting film 10 and the surface of the metal wiring film 9 need not be necessarily flush with each other. The thickness of the polishing rate adjusting film 10 may be suitably set on the basis of the thickness of the metal wiring film 9 and the relative polishing rate of the polishing rate adjusting film 10 with respect to the barrier metal film 7 and the metal wiring film 9.

Although in the present embodiment, the secondary metal wiring 21 is connected to each of the primary metal wires 3a and 3b through the plurality of contact holes 6, it may be connected to each of the primary metal wires 3a and 3b through one contact hole. Where it is desired to increase the connection area between the secondary metal wiring 21 and each of the primary metal wires 3a and 3b, however, it is preferable that the secondary metal wiring 21 is connected to each of the primary metal wires 3a and 3b through the plurality of contact holes 6. Consequently, the depression 9a occurring on the surface of the metal wiring film 9 can be made smaller, as compared with that in a case where one large contact hole is formed.

FIGS. 5A to 5G are cross-sectional views showing the steps of a method of fabricating a semiconductor device according to a fifth embodiment of the present invention. The fabricating method shown in FIGS. 4A to 4G is a method for embedding the secondary metal wiring in the new insulating film 4 on the primary metal wiring 3. On the other hand, the fabricating method shown in FIGS. 5A to 5G is a method for forming a recess on the surface of an insulating film formed on a semiconductor substrate and disposing primary metal wiring in a state where it is embedded in the recess.

An insulating film 32 composed of $SiO_2$, for example, is first formed on one surface of a silicon substrate 31 by CVD or thermal oxidation for oxidizing the one surface of the silicon substrate 31. As shown in FIG. 5A, a recess 33 for embedding metal wiring is formed in a portion, corresponding to a region, where primary metal wiring should be formed, on the surface of the insulating film 32 by a photolithographic technique.

As shown in FIG. 5B, a barrier metal film 34 composed of TiN, for example, is formed by sputtering on the insulating film 32 having the recess 33 formed therein. Further, as shown in FIG. 5C, a seed film 35 composed of Cu, for example, is formed by sputtering on the barrier metal film 34. As shown in FIG. 5D, a metal wiring film 36 composed of the same metal as the seed film 35 is formed on the seed film 35 by electroplating, for example. The metal wiring film 36 is formed to such a thickness that the bottom surface of a depression 36a occurring on the surface thereof is higher than a surface 32a outside the recess 33 in the insulating film 32. Where the thickness of the insulating film 32 is approximately 2 $\mu$m, and the depth of the recess 33 is approximately 1 $\mu$m, for example, the thickness of the metal wiring film 36 is set to a thickness of not less than approximately 1 $\mu$m from a surface, outside the recess 33, of the seed film 35.

As shown in FIG. 5E, a polishing rate adjusting film 37 whose polishing rate in CMP processing performed later is lower than that of the metal wiring film 36 and is higher than that of the barrier metal film 34 is formed in the depression 36a on the surface of the metal wiring film 36. Thereafter, as shown in FIG. 5F, an unnecessary portion of the metal wiring film 36 and a portion, outside the recess 33, of the seed film 35 are polished by performing the CMP processing. As shown in FIG. 5G, the whole of the portions, outside the recess 3, of the seed film 35 and the barrier metal film 34 is removed, so that the surface 32a outside the recess 3 in the insulating film 32 is exposed. When the surface 32a and the surface of the metal wiring film 36 are almost flush with each other, the CMP processing is terminated. Consequently, it is possible to obtain the pattern of primary metal wiring 38.

As described in the foregoing, the present invention is also applicable to a case where the primary metal wiring 38 is formed in the insulating film 32 on the silicon substrate 31. That is, the polishing rate adjusting film 37 having a suitable thickness is formed in the depression 36a occurring on the surface of the metal wiring film 36, and the CMP processing for removing the unnecessary portion of the metal wiring film 36 is then performed. Consequently, the surface 32a of the insulating film 32 and the surface of the metal wiring film 36 can be almost flush with each other, thereby making it possible to prevent the primary metal wiring 38 from being dished.

FIGS. 6A to 6F are cross-sectional views showing the steps of a method of fabricating a semiconductor device according to a sixth embodiment of the present invention. In FIGS. 6A to 6F, portions corresponding to the portions shown in FIGS. 4A to 4G are assigned the same reference numerals as those shown in FIG. 4A to 4G.

In the above-mentioned fourth embodiment, the polishing rate adjusting film 10 for adjusting the progress of the polishing in the CMP processing is formed in the depression 9a occurring on the surface of the metal wiring film 9, so that the surface, outside the recess 5, of the insulating film 4 and the surface of the metal wiring film 9 are almost flush with each other at the time point where the CMP processing is terminated. When the barrier metal film 7 is not formed between the insulating film 4 and the seed film 8, for example, however, the progress of the polishing in the CMP processing need not be adjusted, and the whole surface of the metal wiring film 9 may be uniformly polished.

Figure 6A:
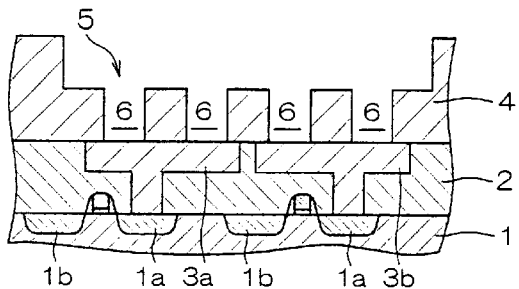
FIGS. 6A to 6F are cross-sectional views showing the steps of a method of fabricating a semiconductor device according to a sixth embodiment of the present invention.

In the fabricating method according to the sixth embodiment, a recess 5 and a plurality of contact holes 6 reaching the surface of primary metal wiring 3 from the bottom surface of the recess 5 are first formed in an insulating film 4 by a photolithographic technique, as shown in FIG. 6A. As shown in FIG. 6B, a seed film 8 composed of a metal material, which is not easily oxidized, for example, Au is then formed by sputtering on the surface of the insulating film 4 and on the surface of primary metal wiring 3 exposed through the recess 5 and the contact holes 6. As shown in FIG. 6C, a metal wiring film 9 composed of the same metal material (for example, Au) of as the seed film 8 is formed on the surface of the seed film 8 by electroplating, for example. At this time, the thickness of the metal wiring film 9 is set such that the bottom surface of a depression 9a is higher than a surface 4a outside the recess 5 in the insulating film 4, and is set to a thickness of approximately 3 μm from a surface, outside the recess 5, of the seed film 8, for example.

Figure 6D:
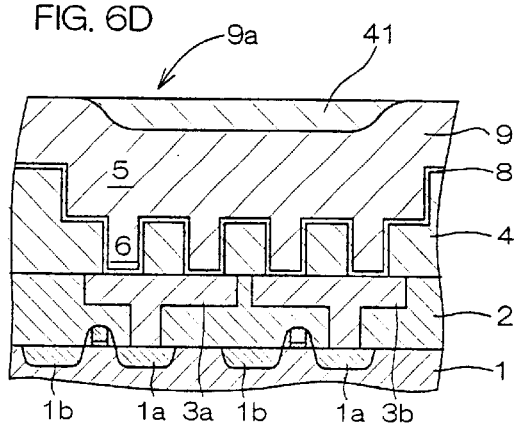
Figure 6B:
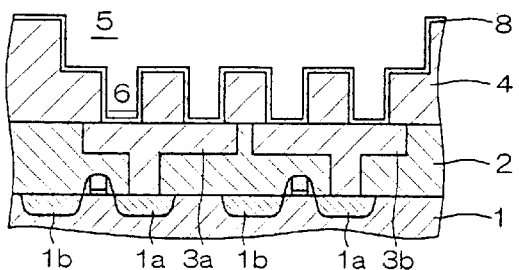

As shown in FIG. 6D, powder of a metal material (for example, Au) of the same type as that of the metal wiring film 9 is embedded in the depression 9a on the surface of the metal wiring film 9, followed by baking processing, thereby forming a flattening metal film 41 for changing the surface of the metal wiring film 9 to a nearly flat surface. It is preferable that the temperature at which the baking processing is performed is approximately 400 to 500° C. The processing time may be set to sufficient time for the metal material powder applied to the inside of the depression 9a to be sintered.

Figure 6E:
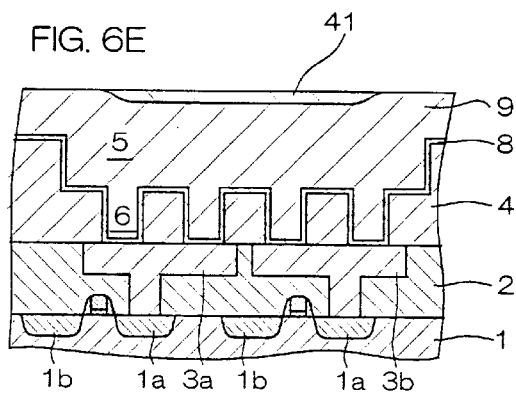
Figure 6C:
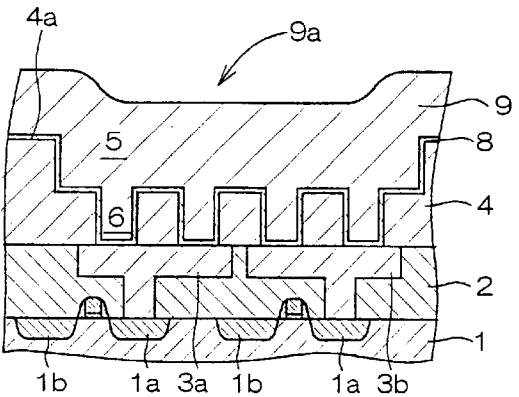
Figure 6F:
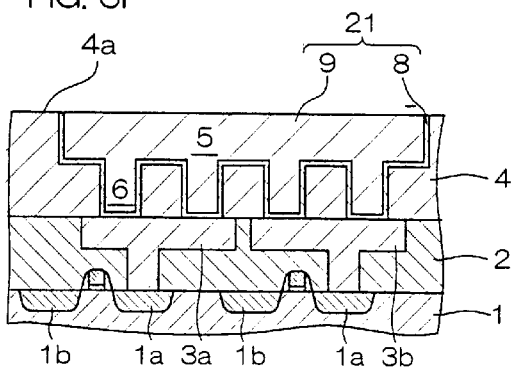

After the flattening metal film 41 is thus formed, CMP processing is performed, as shown in FIG. 6E, to polish the surface of the metal wiring film 9 which has been flattened by the flattening metal film 41. At this time, a contact surface between a surface plate pad for the CMP processing and the metal wiring film 9 becomes a flat surface, so that the whole surface of the metal wiring film 9 is almost uniformly polished. As shown in FIG. 6F, the whole of a portion, outside the recess 5, of the seed film 8 is removed, so that the surface 4a outside the recess 5 in the insulating film 4 is exposed. When the surface 4a and the surface of the metal wiring film 9 are almost flush with each other, the CMP processing is terminated. Consequently, secondary metal wiring 21 is obtained.

As described in the foregoing, where a barrier metal film is not formed between the insulating film 4 and the seed film 8, for example, the flattening metal film 41 composed of the metal material of the same type as that of the metal wiring film 9 is formed in the depression 9a occurring on the surface of the metal wiring film 9, to flatten the surface of the metal wiring film 9. Thereafter, by performing the CMP processing, the surface 4a outside the recess 5 in the insulating film 4 and the surface of the metal wiring film 9 can be almost flush with each other. Accordingly, it is possible to prevent the secondary metal wiring 21 from being dished.

FIGS. 7A to 7E are cross-sectional views showing the steps of a method of fabricating a semiconductor device according to a seventh embodiment of the present invention. In FIGS. 7A to 7E, portions corresponding to the portions shown in FIGS. 6A to 6F are assigned the same reference numerals as those shown in FIGS. 6A to 6F.

In the fabricating method shown in FIGS. 6A to 6F, the thickness of the metal wiring film 9 is set such that the bottom surface of the depression 9a is higher than the surface 4a outside the recess 5 in the insulating film 4. The whole of the flattening metal film 41 formed inside the recess 9a is ground away by the CMP processing. Contrary to this, in the fabricating method shown in FIGS. 7A to 7E, the thickness of a metal wiring film 9 is set such that the bottom surface of a depression 9a is lower than a surface 4a outside a recess 5 in an insulating film 4, so that a part of a flattening metal film 41 formed inside the depression 9a is left as a part of secondary metal wiring 21.

Figure 7A:
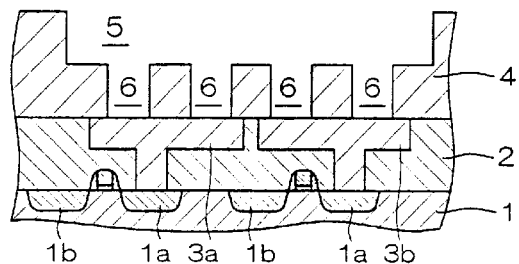
FIGS. 7A to 7E are cross-sectional views showing the steps of a method of fabricating a semiconductor device according to a seventh embodiment of the present invention.
Figure 7B:
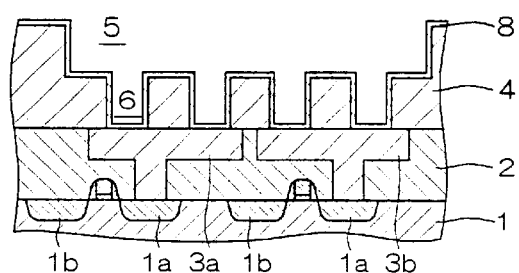
Figure 7C:
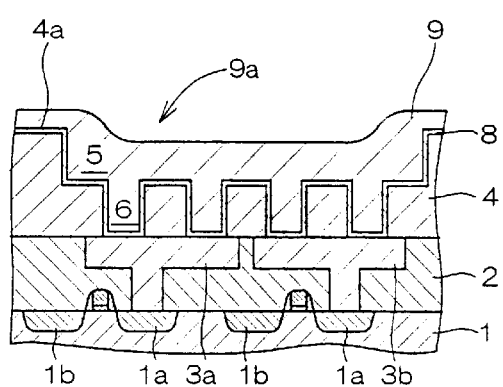

More specifically, as shown in FIGS. 7A to 7C, a seed film 8 composed of a metal material, which is not easily oxidized, for example, Au is first formed by sputtering on the insulating film 4 having the recess 5 and contact holes 6 formed therein, followed by electroplating, for example, to form a metal wiring film 9 composed of a metal material (for example, Au) of the same type as that of the seed film 8 on the surface of the seed film 8. At this time, the thickness of the metal wiring film 9 is set such that the bottom surface of the depression 9a is lower than the surface 4a outside the recess 5 in the insulating film 4, and is set to a thickness of approximately 1 μm from a surface, outside the recess 5, of the seed film 8, for example.

Figure 7D:
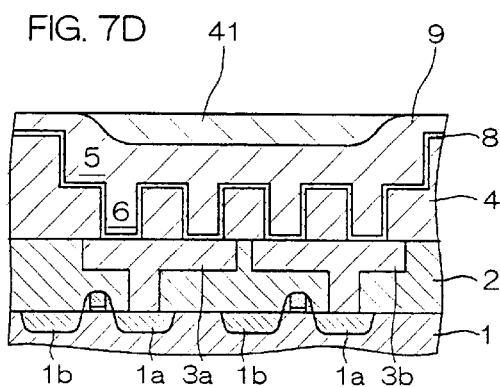
Figure 7E:
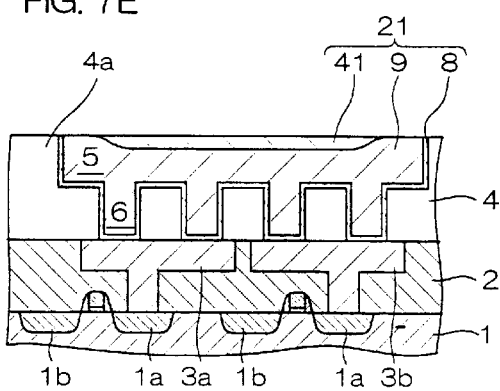
Figure 8A:
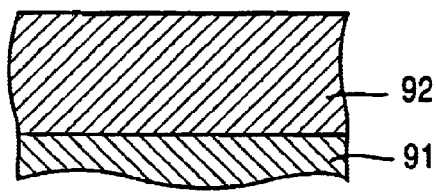
FIGS. 8A to 8G are cross-sectional views showing the step of forming a metal wiring pattern by a conventional damascene process.
Figure 8B:
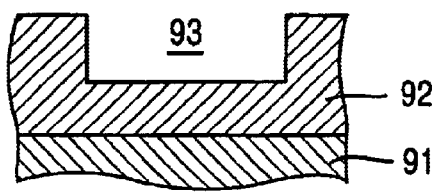
Figure 8C:
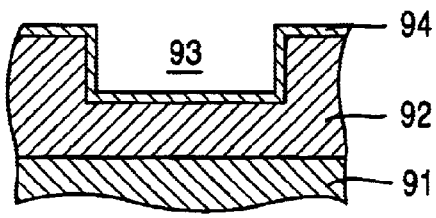
Figure 8D:
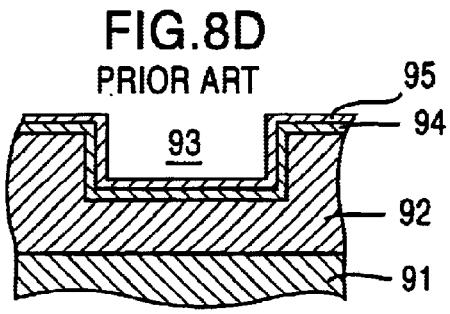
Figure 8E:
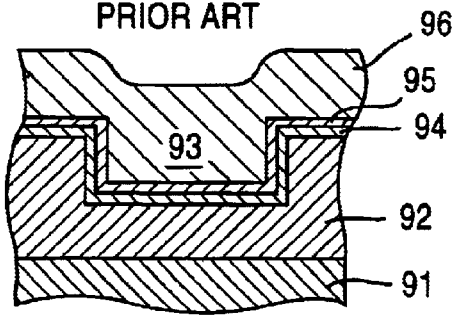
Figure 8F:
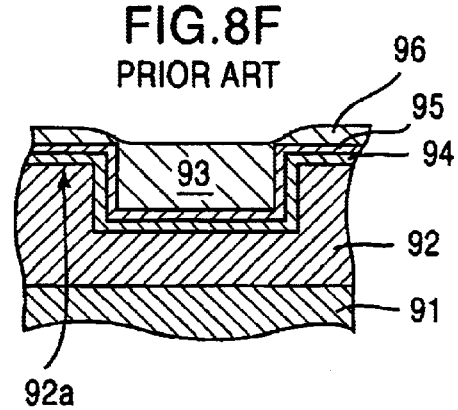
Figure 8G:
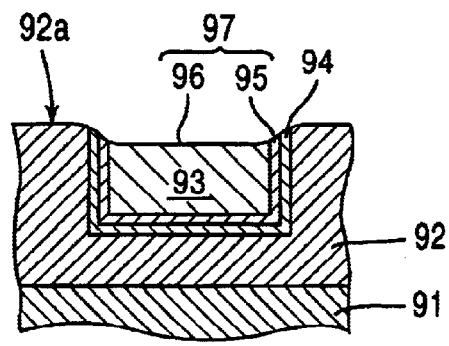

As shown in FIG. 7D, powder of a metal material (for example, Au) of the same type as that of the metal wiring 9 is then embedded in the depression 9a on the surface of the metal wiring film 9, followed by backing processing, thereby forming the flattening metal film 41 for changing the surface of the metal wiring film 9 to a nearly flat surface. After the flattening metal film 41 is thus formed, CMP processing is performed, as shown in FIG. 7E, to polish the surface of the metal wiring film 9 which has been flattened by the flattening metal film 41. At this time, a contact surface between a surface plate pad for CMP processing and the metal wiring film 9 becomes a flat surface, so that the whole surface of the metal wiring film 9 is almost uniformly polished. As shown in FIG. 7E, the whole of a portion, outside the recess 5, of the seed film 8 is removed, so that the surface 4a outside the recess 5 in the insulating film 4 is exposed. When the surface 4a and the surfaces of the metal wiring film 9 and the flattening metal film 41 are almost flush with each other, the CMP processing is terminated. Consequently, the secondary metal wiring 21 composed of the seed film 8, the metal wiring film 9, and the flattening metal film 41 is obtained.

As described in the foregoing, even by the fabricating method shown in FIGS. 7A to 7E, the surface 4a outside the recess 5 in the insulating film 4 and the surface of the secondary metal wiring 21 can be made flush with each other, thereby making it possible to prevent the secondary metal wiring 21 from being dished. The flattening metal film 41 is composed of a metal material of the same type as that of the seed film 8 and the metal wiring film 9. Even if the flattening metal film 1 remains inside the depression 9a of the metal wiring film 9 after the CMP processing, therefore, the electrical resistance of the secondary metal wiring 21 is not affected.

Furthermore, the amount of a metal wiring material required to form the metal wiring film 9 can be made smaller, as compared with that in the fabricating method shown in FIGS. 6A to 6E. Accordingly, a semiconductor device can be constructed at low cost.

Although description has been made of the seven embodiments of the present invention, the present invention is not limited to each of the above-mentioned embodiments. For example, a patterning mask may be composed of a nitride such as $Si_3N_4$ (silicon nitride) in addition to an oxide such as $SiO_2$, described above.

In the above-mentioned first to third embodiments, the seed film is formed by sputtering on the barrier metal film, and the metal wiring film is formed by electroplating on the seed film. However, the seed film need not be necessarily formed. For example, the metal wiring film may be directly formed by sputtering on the barrier metal film.

Similarly, in the fourth to seventh embodiments, the seed film is formed by sputtering on the barrier metal film or the insulating film, and the metal wiring film is formed by electroplating on the seed film. However, the seed film need not be necessarily formed. For example, the metal wiring film may be directly formed by sputtering on the barrier metal film or the insulating film.

Although the semiconductor device fabricating methods according to the sixth and seventh embodiments are applied to disposition of the secondary metal wiring on the primary metal wiring, they are not limited to a case where the secondary metal wiring is disposed. For example, they may be applied to disposition of the primary metal wiring.

Although the present invention has been described and illustrated in detail, it is clearly understood that the same is by way of illustration and example only and is not to be taken by way of limitation, the spirit and scope of the present invention being limited only by the terms of the appended claims.

This application claims priority benefits under 35 U.S.C. Section 119 of Japanese Patent Application Serial Nos. 10-361218, 10-361221, and 10-361222 filed with the Japanese Patent Office on Dec. 18, 1998, the disclosure of these applications being incorporated herein by reference.

What is claimed is:

1. A method of fabricating a semiconductor device by disposing metal wiring on a surface of an insulating film formed on a semiconductor substrate, comprising the steps of:

forming a recess in the insulating film;

laminating a barrier metal film on the insulating film having the recess formed therein;

selectively removing a portion, outside the recess, of the barrier metal film;

depositing a metal wiring film composed of a metal wiring material on the barrier metal film remaining in the recess after removing the barrier metal film; and polishing the metal wiring film by chemical mechanical polishing.

2. The method according to claim 1, wherein the step of polishing the metal wiring film by the chemical mechanical polishing is terminated at the time point where the surface, outside the recess, of the insulating film is exposed.

3. The method according to claim 1, wherein the step of selectively removing the barrier metal film comprises the step of removing the portion, outside the recess, of the barrier metal film by the chemical mechanical polishing.

4. The method according to claim 1, wherein the step of selectively removing the barrier metal film comprises the steps of forming a patterning mask for selectively covering a surface, inside the recess, of the barrier metal film, and selectively removing by etching a portion, other than a portion masked by the patterning mask, of the barrier metal film.

5. A method of fabricating a semiconductor device by disposing metal wiring on a surface of an insulating film formed on a semiconductor substrate, comprising the steps of:

forming a recess in the insulating film;

depositing a metal wiring film composed of a metal wiring material on the insulating film having the recess formed therein;

selectively forming a polishing adjusting film in a depression occurring, opposite to the recess, on the surface of the deposited metal wiring film; and polishing the metal wiring film by chemical mechanical polishing after forming the polishing adjusting film.

6. The method according to claim 5, wherein the step of selectively forming the polishing adjusting film comprises the steps of applying a material for the polishing adjusting film to the depression, and baking the applied material for the polishing adjusting film.

7. The method according to claim 5, wherein the step of laminating a barrier metal film on the insulating film having the recess formed therein is further included between the step of forming the recess and the step of depositing the metal wiring film, and the polishing adjusting film is a polishing rate adjusting film whose polishing rate by the chemical mechanical polishing is lower than that of the metal wiring film and is higher than that of the barrier metal film.

8. The method according to claim 5, wherein the polishing adjusting film is formed using a material whose polishing rate by the chemical mechanical polishing is approximately equal to that of the metal wiring film.

9. The method according to claim 8, wherein the metal wiring film is formed to such a thickness that a bottom surface of the depression is lower than the surface, outside the recess, of the insulating film.

10. The method according to claim 5, wherein the metal wiring film is formed to such a thickness that a bottom surface of the depression is higher than the surface, outside the recess, of the insulating film.

11. The method according to claim 5, wherein the polishing adjusting film is formed such that the surface thereof is almost flush with the surface of the metal wiring film.

12. The method according to claim 5, wherein the polishing adjusting film is composed by the same metal as the metal wiring.

* * * * *